(12) United States Patent
Tao et al.

(10) Patent No.: US 9,099,448 B2
(45) Date of Patent: Aug. 4, 2015

(54) THREE-DIMENSIONAL SYSTEM-LEVEL PACKAGING METHODS AND STRUCTURES

(75) Inventors: Yujuan Tao, Nantong (CN); Lei Shi, Nantong (CN); Honghui Wang, Nantong (CN)

(73) Assignee: NANTONG FUJITSU MICROELECTRONICS CO., LTD., Nantong (CN)

( * ) Notice: Subject to any disclaimer, the term of this patent is extended or adjusted under 35 U.S.C. 154(b) by 0 days.

(21) Appl. No.: 13/984,967

(22) PCT Filed: Mar. 22, 2012

(86) PCT No.: PCT/CN2012/072772
§ 371 (c)(1),
(2), (4) Date: Aug. 12, 2013

(87) PCT Pub. No.: WO2012/126379
PCT Pub. Date: Sep. 27, 2012

(65) Prior Publication Data
US 2013/0320535 A1 Dec. 5, 2013

(30) Foreign Application Priority Data

Mar. 23, 2011 (CN) .......................... 2011 1 0070278
Mar. 23, 2011 (CN) .......................... 2011 1 0070487

(51) Int. Cl.
*H01L 23/48* (2006.01)
*H01L 23/52* (2006.01)
(Continued)

(52) U.S. Cl.
CPC .............. *H01L 23/485* (2013.01); *H01L 21/58* (2013.01); *H01L 23/5389* (2013.01);
(Continued)

(58) Field of Classification Search
CPC ....... H01L 25/00; H01L 23/485; H01L 21/60; H01L 23/52
USPC .................. 257/738, 773–777, 686; 438/118, 438/106–108, 455–458, 612–615
See application file for complete search history.

(56) References Cited

U.S. PATENT DOCUMENTS

2005/0104181 A1* 5/2005 Lee et al. ........................ 257/686
2005/0212126 A1* 9/2005 Sunohara ....................... 257/730
(Continued)

FOREIGN PATENT DOCUMENTS

| CN | 2664198 Y | 12/2004 |
| CN | 1707792 A | 12/2005 |
| CN | 101330068 A | 12/2008 |
| CN | 102157393 A | 8/2011 |
| TW | 200837922 A | 9/2008 |

OTHER PUBLICATIONS
English translation of FP: TW200837922.*

*Primary Examiner* — Amar Movva
*Assistant Examiner* — Sheikh Maruf
(74) *Attorney, Agent, or Firm* — Anova Law Group, PLLC (57) ABSTRACT

A 3D system-level packaging method includes providing a packaging substrate, forming a glue layer on the substrate, and attaching a first chip layer at an opposite side of a functional surface of the first chip layer on the packaging substrate through the glue layer. The method also includes forming a first sealant layer on the packaging substrate at a same side attached with the first chip layer and exposing bonding pads of the first chip layer. The method also includes forming first vias in the first sealant layer, forming first vertical metal wiring in the first vias, and forming a first horizontal wiring layer on the sealant layer interconnecting the first chip layer and the first vertical metal wiring. Further, the method includes forming a plurality of package layers on the first sealant layer, and each of the plurality of package layers includes a chip layer, a sealant layer covering the chip layer, and vertical metal wiring and a horizontal wiring layer interconnecting adjacent package layers.

20 Claims, 5 Drawing Sheets

(51) Int. Cl.
  *H01L 23/02*   (2006.01)
  *H01L 23/485*  (2006.01)
  *H01L 25/00*   (2006.01)
  *H01L 21/58*   (2006.01)
  *H01L 23/538*  (2006.01)
  *H05K 1/18*    (2006.01)

(52) U.S. Cl.
  CPC ...... *H01L 25/00* (2013.01); *H01L 2224/12105* (2013.01); *H01L 2224/131* (2013.01); *H01L 2224/13111* (2013.01); *H01L 2224/32145* (2013.01); *H01L 2224/32225* (2013.01); *H01L 2224/73267* (2013.01); *H01L 2924/00013* (2013.01); *H01L 2924/014* (2013.01); *H05K 1/185* (2013.01)

(56) References Cited

U.S. PATENT DOCUMENTS

| | | | |
|---|---|---|---|
| 2007/0155048 A1* | 7/2007  | Lee et al.     | 438/106 |
| 2008/0136004 A1* | 6/2008  | Yang et al.    | 257/686 |
| 2008/0308921 A1* | 12/2008 | Kim            | 257/686 |
| 2008/0318363 A1* | 12/2008 | Kwon et al.    | 438/113 |
| 2010/0109164 A1* | 5/2010  | Kang et al.    | 257/774 |
| 2010/0213618 A1* | 8/2010  | Pagaila et al. | 257/774 |
| 2010/0216281 A1* | 8/2010  | Pagaila et al. | 438/107 |
| 2010/0258932 A1* | 10/2010 | Yoshida et al. | 257/686 |
| 2011/0037159 A1* | 2/2011  | McElrea et al. | 257/686 |
| 2011/0248410 A1* | 10/2011 | Avsian et al.  | 257/777 |
| 2013/0105991 A1* | 5/2013  | Gan et al.     | 257/777 |

* cited by examiner

THREE-DIMENSIONAL SYSTEM-LEVEL PACKAGING METHODS AND STRUCTURES

CROSS-REFERENCES TO RELATED APPLICATIONS

This application claims the priority of Chinese patent application no. 201110070278.2, filed on Mar. 23, 2011, and Chinese patent application no. 201110070487.7, filed on Mar. 23, 2011, the entire contents of all of which are incorporated herein by reference.

FIELD OF THE INVENTION

The present invention relates to semiconductor technologies in general and, more specifically, to the methods and structures for three-dimensional (3D) system-level semiconductor packaging.

BACKGROUND

Wafer Level Packaging (WLP) is a technique for packaging and testing an entire wafer and then cutting the tested wafer into individual finished chips such that the finished chips after packaging are the same sizes as the dies. The WLP technology completely revolutionized traditional packaging technologies such as Ceramic Leadless Chip Carrier and Organic Leadless Chip Carrier. This technique meets the growing market demands for lighter, smaller, thinner, and lower-cost microelectronic products. Through the wafer-level chip-size packaging technique, the chip size may achieve a high-degree of miniaturization and, consequently, the chip cost is significantly reduced with the decrease of the chip size and the increase of the wafer size. The wafer-level chip-size packaging technique may enable a true integration of integrated circuit (IC) design, wafer fabrication, packaging and testing, and substrate manufacturing at the wafer level, representing one of current research focuses in the packaging technology and leading the future development trend.

Fan-out wafer level packaging is one type of wafer-level packaging technologies. For example, Chinese patent application 200910031885.0 disclosed one wafer-level fan-out chip packaging method, the process steps including: covering the circular carrier substrate surface with a stripping film and a thin film dielectric layer I sequentially, and forming photolithography pattern openings I on the thin film dielectric layer I; forming metal electrodes connecting the substrate and re-wiring metal wires on the photolithography pattern openings I and its surface; covering the surfaces of metal electrodes connecting the substrate, re-wiring metal wires, and thin film dielectric layer I with thin-film dielectric layer II, and forming photolithography pattern openings II on the thin film dielectric layer II; constructing metal electrodes connecting chips on the photolithography pattern openings II; flipping the chips onto the metal electrodes and performing plastic encapsulation and curing to form a packaging structure with a plastic sealant layer; separating the circular carrier substrate and the striping film from the packaging structure with the plastic sealant layer to form a plastic-encapsulated wafer; planting and reflowing balls to form solder balls or bumps; cutting the plastic-encapsulated wafer into individual finished fan-out chip structures.

However, the final products made by the above packaging method may only support a single chip function. To achieve complete system functions, peripheral circuits including capacitors, inductors or resistors may need to be added at the outside of the final products. Further, the above method may be unable to be applied to manufacturing of multi-layer packaging structures with complex connections. Further, when such packaging method is used, the system-level packaging integration degree may be still undesired.

The disclosed methods and systems are directed to solve one or more problems set forth above and other problems.

BRIEF SUMMARY OF THE DISCLOSURE

One aspect of the present disclosure includes a 3D system-level packaging method. The method includes providing a packaging substrate, forming a glue layer on the substrate, and attaching a first chip layer at an opposite side of a functional surface of the first chip layer on the packaging substrate through the glue layer. The method also includes forming a first sealant layer on the packaging substrate at a same side attached with the first chip layer and exposing bonding pads of the first chip layer. The method also includes forming first vias in the first sealant layer, forming first vertical metal wiring in the first vias, and forming a first horizontal wiring layer on the sealant layer interconnecting the first chip layer and the first vertical metal wiring. Further, the method includes forming a plurality of package layers on the first sealant layer, and each of the plurality of package layers includes a chip layer, a sealant layer covering the chip layer, and vertical metal wiring and a horizontal wiring layer interconnecting adjacent package layers.

Another aspect of the present disclosure includes a 3D system-level packaging structure. The 3D system-level packaging structure includes a packaging substrate, a glue layer formed on the substrate, a first chip layer, and a first sealant layer. The first chip layer is attached on the packaging substrate through the glue layer at an opposite side of a functional surface of the first chip layer. The first sealant layer is formed on the packaging substrate at a same side attached with the first chip layer and exposing bonding pads of the first chip layer. Further, the 3D system-level packaging structure includes first vias formed in the first sealant layer, first vertical metal wiring formed in the first vias, a first horizontal wiring layer, and a plurality of package layers. The first horizontal wiring layer is formed on the sealant layer interconnecting the first chip layer and the first vertical metal wiring. The plurality of package layers are formed on the first sealant layer, and each of the plurality of package layers includes a chip layer, a sealant layer covering the chip layer, and vertical metal wiring and a horizontal wiring layer interconnecting adjacent package layers.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
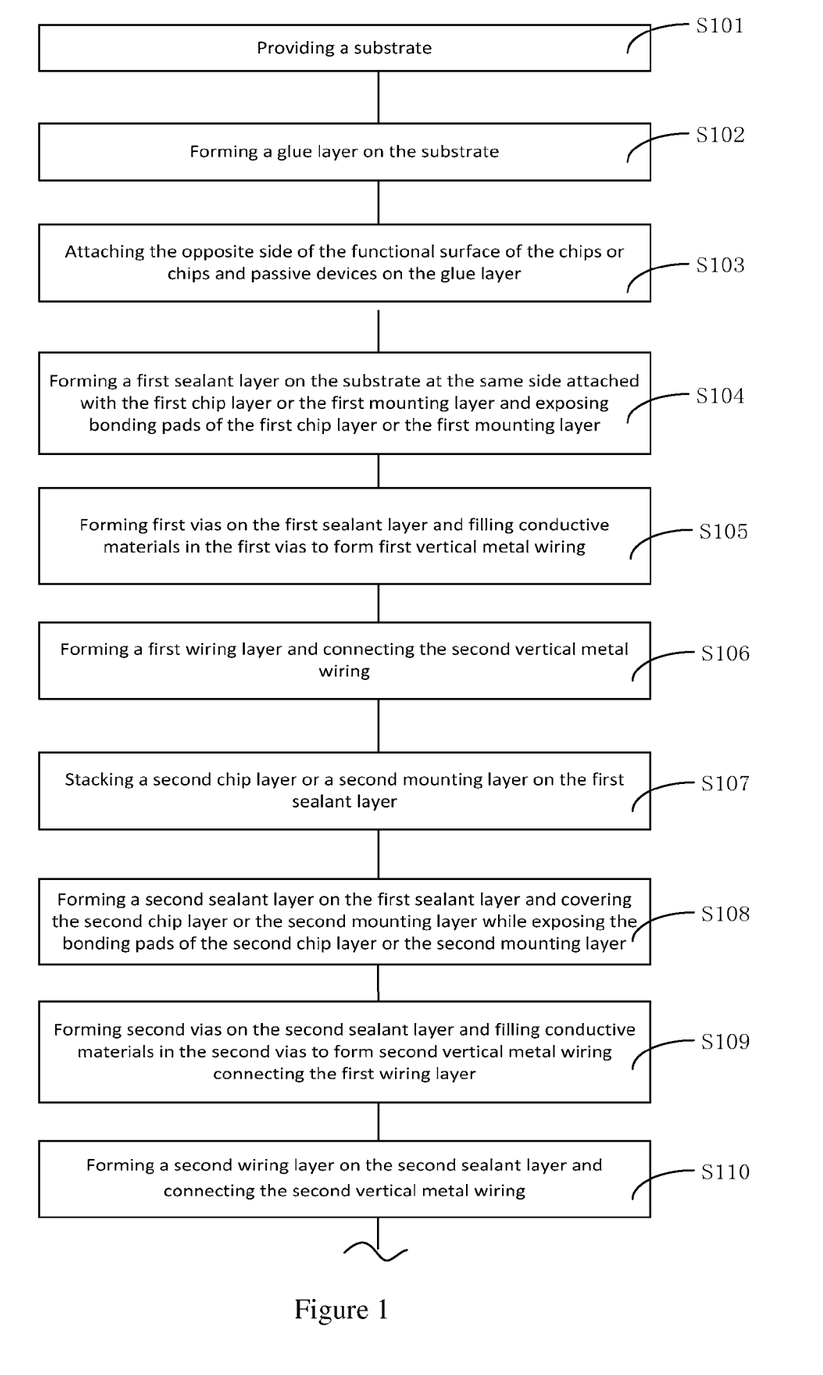
FIGS. 1 and 2 illustrate an exemplary 3D system-level packaging process consistent with the disclosed embodiments.
Figure 2:
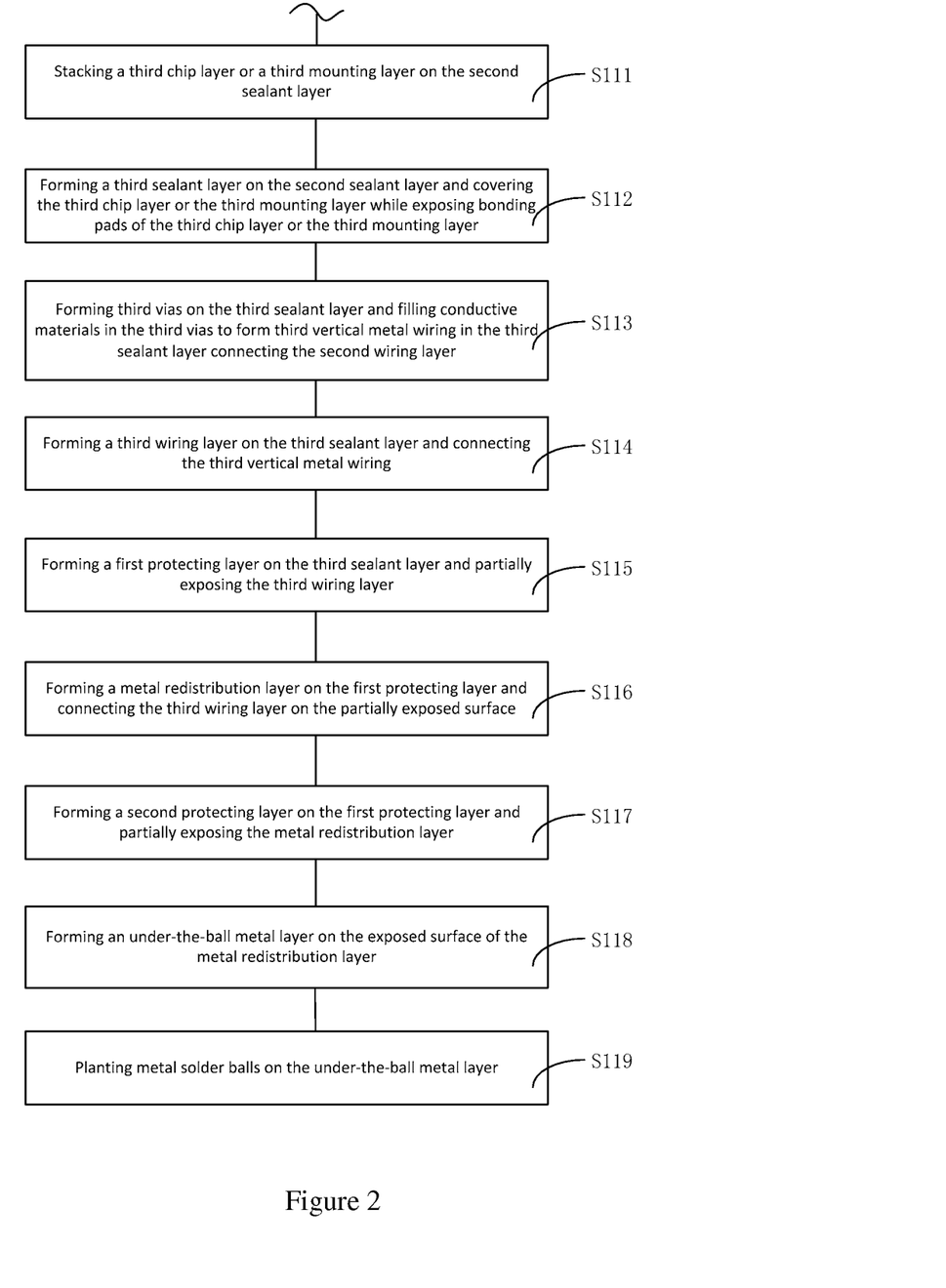
Figure 3:
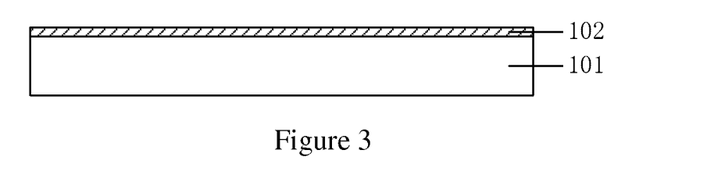
FIGS. 3-9 illustrate exemplary packaging structures corresponding to various steps in the 3D system-level packaging process consistent with the disclosed embodiments.

FIGS. 1-2 illustrate an exemplary 3D system-level packaging process consistent with the disclosed embodiments. As shown in FIG. 1, at the beginning of the process, a packaging substrate is provided (S101). FIG. 3 shows an exemplary structure corresponding to S101.

As shown in FIG. 3, a substrate 101 is provided. The substrate 101 may include any appropriate material used for IC packaging. For example in this embodiment, substrate 101 may include a silicon-based substrate (e.g., a wafer substrate). The silicon-based substrate may be configured to have metal wiring to achieve the circuit integration function for the final products. Other types of substrates may also be used. For example, based on different designs, substrate 101 may also include a glass material for desired hardness and flatness.

Returning to FIG. 1, after the substrate 101 is provided, a glue layer may be formed on the substrate (S102). FIG. 3 shows an exemplary structure corresponding to S102.

As shown in FIG. 3, a glue layer 102 is formed on the substrate 101. The substrate 101 may be the base both for a subsequent first chip layer or first mounting layer and each layer of packaging structures formed subsequently. The glue layer 102 may be used to affix or attach the first chip layer or the first mounting layer on the substrate 101. Further, the glue layer 102 may be formed on the substrate 101 by any appropriate means, such as spin coating or printing. Under certain circumstances, glue layer 102 may be omitted or other attaching means may be used.

Figure 4:
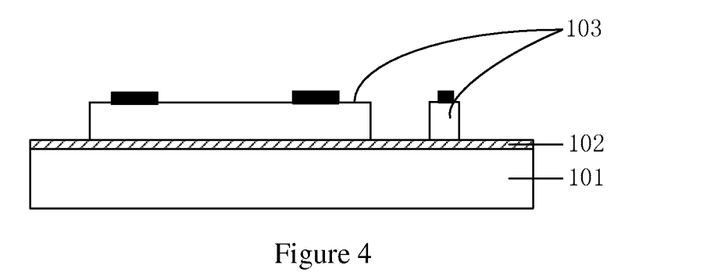

Returning to FIG. 1, after the glue layer 102 is formed on substrate 101, a first chip layer or a first mounting layer may be attached on the substrate 101 at the opposite side of the functional surface of the chips or chips and passive devices in the first chip layer or the first mounting layer (S103). FIG. 4 shows an exemplary structure corresponding to S103.

As shown in FIG. 4, first chip layer or the first mounting layer 103 may be attached on the substrate 101 at the opposite side of the functional surface of the chips and passive devices in the first chip layer or the first mounting layer 103. As used herein, the functional surface of the first chip layer or the first mounting layer 103 refers to the surface having chip solder pad(s) or bonding pad(s) and passive device solder pad(s) or bonding pad(s).

The first chip layer or the first mounting layer 103 and any subsequent chip layer or mounting layer may include a single chip or multiple chips, i.e., a chip group. When multiple chips are included, the multiple chips may be of the same type or different types. Similarly, the first chip layer or the first mounting layer 103 and any subsequent chip layer or mounting layer may include a single passive device or multiple passive devices, i.e., a passive device group. When multiple passive devices are included, the multiple passive devices may be of the same type or different types. Depending on particular circuitry designs, a chip layer may include a chip group, a passive group, or both. Each chip or each passive device may be one part of a system-level packaging structure to achieve one or more separate functions from various system-level functions to be provided by the system-level packaging structures.

In the first chip or the first mounting layer 103 and any subsequent chip layer or mounting layer, the passive device may be any appropriate passive device, including capacitors, resistors, and/or inductors.

In the first chip layer or the first mounting layer 103, arrangement of chips and passive devices may be designed according to the system functions. For example, a chip or chips may be surrounded by same or different other chip or chips and/or surrounded by same or different capacitors, resistors, and inductors. Similarly, a passive device or passive devices may be surrounded by same or different other passive devices and/or surrounded by one or more same or different chip or chips.

Figure 5:
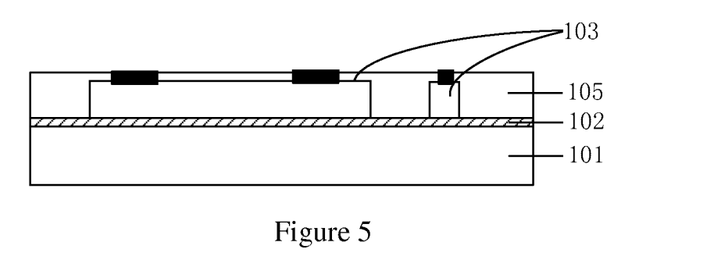

Returning to FIG. 1, after the first chip layer or the first mounting layer 103 is attached on the substrate 101 (S103), a first sealant layer is formed on the substrate at the same side attached with the first chip layer or the first mounting layer 103 (S104). FIG. 5 shows a corresponding structure.

As shown in FIG. 5, the first sealant layer 105 is formed on the top of the substrate covering the first chip layer or the first mounting layer 130 while exposing connection parts of the first chip layer or the first mounting layer 103. That is, the first sealant layer 105 may cover and insulate or isolate components in the first chip layer or the first mounting layer with only the connection parts exposed. The connection parts may include, for instance, the chip bonding pad(s) and the passive device bonding pad(s). During subsequent manufacturing processes, the sealant layer 105 not only can protect the surfaces of chips and passive devices in the first chip layer or the first mounting layer 103 except the exposed bonding pads of the first chip layer 103, but also can serve as a carrier for the subsequent processes. Further, the first sealant layer 105 may also provide isolation and insulation for the electronic components in the first chip layer or the first mounting layer 103.

The first sealant layer 105 may be made of any appropriate materials, and may be formed with an approximately same thickness as that of the first chip layer or the first mounting layer 103. In one embodiment, the first sealant layer 105 is epoxy. Epoxy may be a desired material for the first sealant layer 105 due to its high sealing performance and easy molding. Further, the first sealant layer may be formed using various methods including turn injection, compression, or printing, etc.

Figure 6:
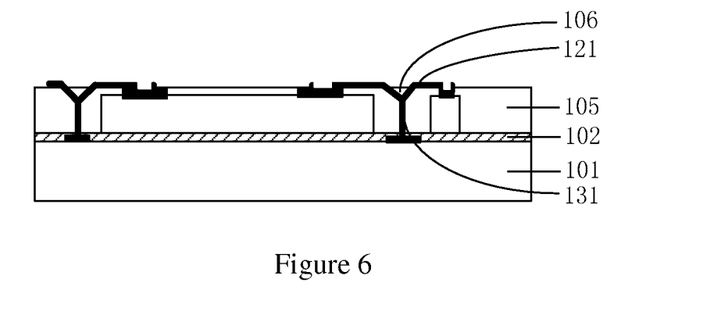

Returning to FIG. 1, after the formation of the first sealant layer 105, first vias are formed in the first sealant layer 105 (S105). FIG. 6 shows an exemplary structure corresponding to S105.

As shown in FIG. 6, first vias 106 are formed in the first sealant layer 105. Conductive material is subsequently filled in the first vias 106 to form the first vertical metal wiring 131. The first vertical metal wiring 131 may be used to achieve electrical connections between the first chip layer or the first mounting layer 103 and the substrate 101 and between the first chip layer or the first mounting layer 103 and other chip layers or mounting layers.

Further, the first vias 106 may be formed by drilling. The first vias may extend through the first sealant layer 105 and expose the substrate 101 to form interconnect channels with substrate 101.

Since the sealant layer 105 has the desired insulating performance, the vertical wiring can be selectively formed in the sealant layer to achieve interconnection between the chip layers or the mounting layers and between the first chip layer or the first mounting layer and the substrate. Component interference in different layers may be reduced or avoided.

Returning to FIG. 1, after the first vertical metal wiring 131 is formed, a first horizontal wiring layer is formed on the top of the first sealant layer 105 (S106). FIG. 6 shows a corresponding structure corresponding to S106.

As shown in FIG. 6, a first horizontal wiring layer 121 is formed on the top of the first sealant layer 105. The first horizontal wiring layer 121 interconnects with the first vertical metal wiring 131. Further, the first horizontal wiring layer 121 may be used to achieve electrical connections among components in the first chip layer or the first mounting layer 103, i.e., interconnections for the first chip layer or the first mounting layer 103. The first vertical metal wiring 131 and the first horizontal wiring layer 121 may be referred as the first wiring layer, and the first chip layer or the first mounting layer 103, the first sealant layer 105, and the first wiring layer may be referred as the first package layer.

Figure 7:
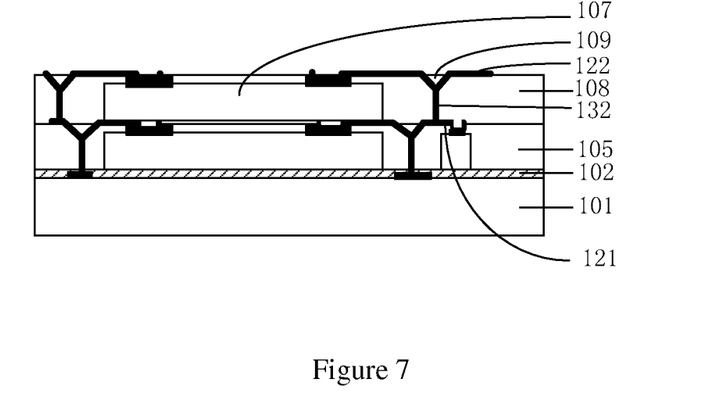

Returning to FIG. 1, after the first wiring layer is completed, a second chip layer or a second mounting layer is stacked on the first sealant layer 105 (S107). FIG. 7 shows an exemplary structure corresponding to S107.

As shown in FIG. 7, a second chip layer or a second mounting layer 107 is stacked on the first sealant layer 105. The term "stacking", as used herein, refers to placing or attaching the second chip layer or the second mounting layer 107 on a predetermined location on the first sealant layer 105. Further, the second chip layer or the second mounting layer 107 is stacked with functional surface facing up.

Returning to FIG. 1, after the second chip layer or the second mounting layer 107 is formed, a second sealant layer is formed on the first sealant layer 105 and covers the second chip layer or the second mounting layer 107 (S108). FIG. 7 also shows an exemplary structure corresponding to S108.

As shown in FIG. 7, a second sealant layer 108 is formed on the top of the first sealant layer 105 and covers the second chip layer or the second mounting layer 107. The second sealant layer 108 is also formed in such a way to expose chip bonding pad(s) and passive device sold pad(s) in the second chip layer or the second mounting layer 107. The second sealant layer 108 may include materials similar to the first sealant layer 105, such as epoxy.

Further, returning to FIG. 1, after the second sealant layer 108 is formed, second vias are formed in the second sealant layer 108 and conductive material is then filled in the second vias to form a second vertical metal wiring (S109). FIG. 7 shows an exemplary structure corresponding to S109.

As shown in FIG. 7, second vias 109 are formed in the second sealant layer 108 and conductive materials is then filled in the second vias 109 to form second vertical metal wiring 132. The second vertical metal wiring 132 connects the first wiring layer 121. Further, the second vias 109 extend through the second sealant layer 108 to partially expose the first horizontal wiring layer 121 to form interconnect channels with the first horizontal wiring layer 121. The second metal vertical wiring 132 may be used to achieve electrical connection between the second chip layer or the second mounting layer 107 and other chip layer(s) or other mounting layer(s) and between the second chip layer or the second mounting layer and the substrate 101 through the first vias 106 in the first sealant layer 105.

Returning to FIG. 1, after the second vertical metal wiring 132 is formed, a second horizontal wiring layer is formed on the second sealant layer 108 (S110). FIG. 7 shows the corresponding structure corresponding to S110.

As shown in FIG. 7, a second horizontal wiring layer 122 is formed on the top of the second sealant layer 108. The second horizontal wiring layer 122 may be used to achieve electrical connection among components of the second chip layer or the second mounting layer 107, i.e., interconnections for the second chip layer or the second mounting layer 107. The second vertical metal wiring 132 and the second horizontal wiring layer 122 may be referred as the second wiring layer; and the second chip layer or the second mounting layer 107, the second sealant layer 108, and the second wiring layer may be referred as the second package layer.

Figure 8:
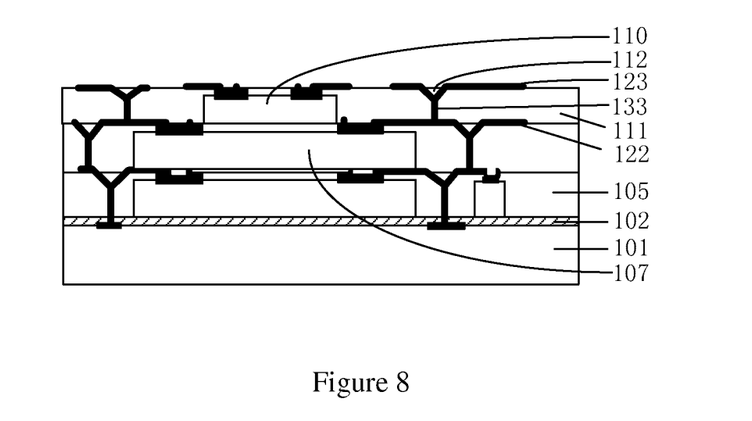

As shown in FIG. 2 (continued from FIG. 1), after the second wiring layer is formed on the top of the second sealant layer 108, a third chip layer or a third mounting layer is stacked on the second sealant layer 108 (S111). FIG. 8 shows an exemplary structure corresponding to S111.

As shown in FIG. 8, a third chip layer or a third mounting layer 110 is formed on the top of the second sealant layer 108. The third chip layer or the third mounting layer 110 may include multi-functional chips. Further, the third chip layer or the third mounting layer 110 is stacked with functional surface facing up.

Returning to FIG. 2, after the third chip layer or the third mounting layer 110 is formed, a third sealant layer is formed on the second sealant layer 108 and covers the third chip layer or the third mounting layer 110 (S112). FIG. 8 also shows an exemplary structure corresponding to S112.

As shown in FIG. 8, the third sealant layer 111 is formed on the top of second sealant layer 108 covering the third chip layer or the third mounting layer 110 while exposing connection parts of the third chip layer or the third mounting layer 110. The third sealant layer 111 may include materials similar to the first sealant layer 105 and/or the second sealant layer 108, such as epoxy.

Returning to FIG. 2, after the third sealant layer 111 is formed, third vias are formed in the third sealant layer 111 and conductive material is then filled in the third vias to form a third vertical metal wiring (S113). FIG. 8 also shows an exemplary structure corresponding to S113.

As shown in FIG. 8, third vias 118 are formed in the third sealant layer 111 and conductive material is then filled in the third vias 118 to form a third vertical metal wiring 133. The third vias 112 extend through the third sealant layer 111 to partially expose the second horizontal wiring layer 122 to form interconnect channels with the second horizontal wiring layer 122. The third vertical wiring 133 may be used to achieve electrical connection between the third chip layer or the third mounting layer 110 and other chip layer(s) or other mounting layer(s) or the substrate 101.

Returning to FIG. 2, after the third vertical metal wiring 133 is formed, a third horizontal wiring layer is formed on the top of the third sealant layer 111 (S114). FIG. 8 shows an exemplary structure corresponding to S114.

As shown in FIG. 8, a third horizontal wiring layer 123 is formed on the top of the third sealant layer 111. The third horizontal wiring layer 123 connects the third vertical metal wiring 133. Further, the third horizontal wiring layer 123 may be used to achieve electrical connections among components in the third chip layer or the third mounting layer 110, i.e., interconnections for the third chip layer or the third mounting layer 110. The third vertical metal wiring 133 and the third horizontal wiring layer 123 may be referred as the third wiring layer, and the third chip layer or the third mounting layer 110, the third sealant layer 111, and the third wiring layer may be referred as the third package layer.

Still in FIG. 8, the third horizontal wiring layer 123 interconnects with the second horizontal wiring layer 122 through the third vertical metal wiring 133. In other words, the upper and lower wiring layers of the third sealant layer 111 are interconnected through the third vias 112, thus achieving the interconnection between the third chip layer or the third mounting layer 110 and the second chip layer or the second mounting layer 107.

Figure 9:
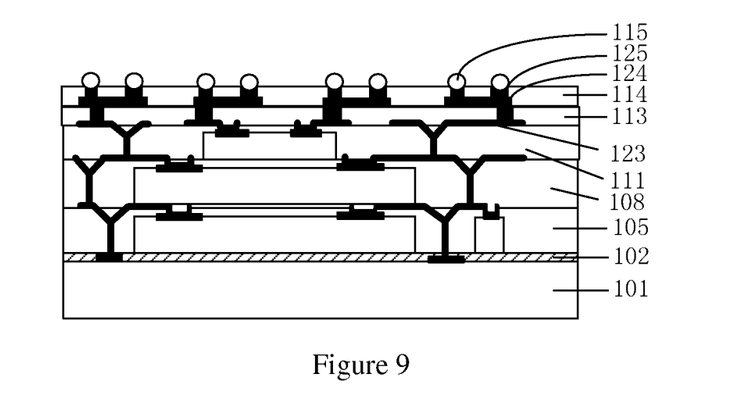

Returning to FIG. 2, after the third horizontal wiring layer 123 is formed, a first protection layer is formed on the third sealant layer 111 and partially exposes the third horizontal wiring layer 123 (S115). FIG. 9 shows an exemplary structure corresponding to S115.

As shown in FIG. 9, a first protection layer 113 is formed on the third sealant layer 111 and partially exposes the third horizontal wiring layer 123. The exposed portion of the third horizontal wiring layer 123 may be used for further wiring or connections. The material for forming the first protection layer 113 may include any appropriate materials, such as polyimide.

Returning to FIG. 2, after a first protection layer is formed, a metal redistribution layer is formed on the first protection layer 113 and connects the third horizontal wiring layer 123 on the partially exposed surface (S116). FIG. 9 shows an exemplary structure corresponding to S116.

As shown in FIG. 9, a metal redistribution layer 124 is formed on the first protection layer 113 and selectively connects the third horizontal wiring layer 123 on the partially exposed surface. The metal redistribution layer 124 may be used to reconfigure or redistribute the interconnections by selectively connecting the exposed connection portion of the third horizontal wiring layer 123.

Returning to FIG. 2, after the metal redistribution layer 124 is formed, a second protection layer is formed on the first protection layer 113 and partially exposing the metal redistribution layer 124 (S117). FIG. 9 shows the exemplary structures corresponding to S117.

As shown in FIG. 9, a second protection layer 114 is formed on the top of the first protection layer 113. Similar to the first protection layer 113, the material for forming the second protection layer 114 may include polyimide. The exposed portion of the metal redistribution layer 124 may be used to output internal circuitry or wiring.

Returning to FIG. 2, after the second protection layer 114 is formed on the first protection layer 113, an under-the-ball metal layer is formed on the exposed surface of the metal redistribution layer 124 (S118). FIG. 9 shows an exemplary structure corresponding to S118.

As shown in FIG. 9, an under-the-ball metal layer 125 is formed on the exposed surface of the metal redistribution layer 124. The term "under-the-ball metal layer" may refer to the metal layer providing connection and support for connection balls or bumps as outputs of the system-level packaging structure.

Returning to FIG. 2, after a under-the-ball metal layer 125 is formed, metal solder balls or bumps are planted on the exposed surfaces of the under-the-ball metal layer 125 (S119). FIG. 9 shows a corresponding structure corresponding to S119.

As shown in FIG. 9, metal solder balls or bumps 115 are planted on the exposed surfaces of the under-the-ball metal layer 125 to form the connection balls. More specially, solder balls or bumps are planted or deposited at locations corresponding to the exposed surfaces of the under-the-ball metal layer 125 so that internal wiring can be outputted. The solder balls may include any appropriate material, such as metal tin or others.

Thus, at this point, a 3D system-level packaging structure is formed, including the plurality of the chip layers or the mounting layers, the interconnection among which is achieved through the wiring layers. Further, the metal redistribution layer 124 may be optional and may be omitted in certain other embodiments. If metal redistribution layer 124 is omitted, the under-the-ball metal layer 125 may be formed on the exposed bonding pads of the chips and/or passive devices in the third chip layer 110 (i.e., the top-level chip layer) over the first protection layer 113. Connection metal solder balls or bumps 115 are then formed on the under-the-ball metal layer 125.

In addition, although three chip layers or mounting layers are used for illustrative purposes, any number of chip layers or mounting layers may be used. For example, FIG. 10 shows another 3D system-level packaging structure with two chip layers or mounting layers.

Figure 10:
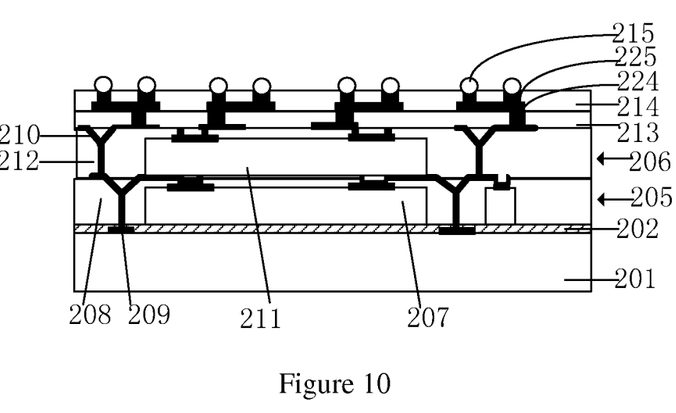
FIG. 10 illustrates another exemplary 3D system-level packaging structure consistent with the disclosed embodiments.

As shown in FIG. 10, similar to the system-level packaging structure in FIG. 9, the 3D system-level packaging structure includes a packaging wafer substrate 201 and a glue layer 202 formed on the substrate 201. A first package layer 205 may be attached on the substrate 201 through the glue layer 202. A second package layer 206 may be stacked on the first package layer 205. Further, a first protection layer 213 may be formed on the second package layer 206 and a metal redistribution layer 224 is formed through the first protection layer 213.

A second protection layer 214 may be formed on the first protection layer 213 and an under-the-ball metal layer 225 is formed through the second protection layer 214. Further, metal solder balls or bumps 215 may be planted on corresponding positions on the under-the-ball metal layer 225.

The first package layer 205 may include a first chip layer or a first mounting layer 207, a first sealant layer 208, and a first wiring layer 209. The second package layer 206 may include a second chip layer or second mounting layer 211, a second sealant layer 212, and a third wiring layer 210. The first chip layer 205, the second chip layer 206, and the substrate 201 may be interconnected through a first wiring layer 209 and a second wiring layer 210.

The disclosed methods and structures may have many advantages over traditional IC packaging technologies. The integration degree of the 3D system-level packaging method and structure may be substantially increased due to the fact that the sealant layers have similar thickness to the chip layers or the mounting layers with desired insulation and isolation performance. Other applications and advantages are obvious to those skilled in the art.

What is claimed is:

1. A method for 3D system-level packaging, comprising:
providing a packaging substrate;
forming a glue layer on the substrate;
attaching a first chip layer at an opposite side of a functional surface of the first chip layer on the packaging substrate through the glue layer;
forming a first sealant layer on the packaging substrate at a same side attached with the first chip layer and exposing bonding pads of the first chip layer;
forming first vias in the first sealant layer;
forming first vertical metal wiring in the first vias;
forming a first horizontal wiring layer on the sealant layer interconnecting the first chip layer and the first vertical metal wiring; and
forming a plurality of package layers on the first sealant layer,
wherein:
each of the plurality of package layers includes a chip layer, a sealant layer covering the chip layer, and vertical metal wiring and a horizontal wiring layer interconnecting adjacent package layers,
each sealant layer of the plurality of package layers is formed on a top of a sealant layer of a preceding package layer, and
each sealant layer of the plurality of package layers and the sealant layer of the preceding package layer are in contact with each other.

2. The method for 3D system-level packaging according to claim 1, wherein a package layer of the plurality package layers is formed by:

stacking a chip layer of the package layer on a sealant layer of a preceding package layer;

forming a sealant layer of the package layer on the sealant layer of the preceding package layer and covering the chip layer while exposing bonding pads of the chip layer;

forming vias in the sealant layer of the package layer and extending to a horizontal wiring layer of the preceding package layer;

forming a vertical metal wiring in the vias and connecting with the horizontal wiring layer of the preceding package layer; and forming a horizontal wiring layer of the package layer on the sealant layer of the package layer and connecting with the vertical metal wiring of the package layer and connecting with the chip layer in the package layer.

3. The method for 3D system-level packaging according to claim 1, further including:

forming a first protection layer on a top-level sealant layer and partially exposing a top-level horizontal wiring layer;

forming a metal redistribution layer on the first protection layer and connecting with the top-level horizontal wiring layer;

forming a second protection layer on the first protection layer and partially exposing the metal redistribution layer;

forming an under-the-ball metal layer on the exposed the metal redistribution layer; and forming metal solder balls on the under-the-ball metal layer.

4. The method for 3D system-level packaging according to claim 1, further including:

forming a first protection layer on a top-level sealant layer and partially exposing a top-level wiring layer;

forming an under-the-ball metal layer on the exposed top-level wiring layer; and forming metal solder balls on the under-the-ball metal layer.

5. The method for 3D system-level packaging according to claim 3, wherein:

the first protection layer or the second protection layer is made of polyimide.

6. The method for 3D system-level packaging according to claim 1, wherein:

the first chip layer or the chip layer includes at least one of a chip group and a passive device group;

the chip group includes one or more chips; and the passive device group includes any of capacitors, resistors, and inductors.

7. The method for 3D system-level packaging according to claim 1, wherein:

the sealant layer is made of epoxy.

8. The method for 3D system-level packaging according to claim 1, wherein:

the sealant layer is formed by turn injection, compression, or printing.

9. A 3D system-level packaging structure, comprising:

a packaging substrate;

a glue layer formed on the substrate;

a first chip layer attached on the packaging substrate through the glue layer at an opposite side of a functional surface of the first chip layer;

a first sealant layer formed on the packaging substrate at a same side attached with the first chip layer and exposing bonding pads of the first chip layer;

first vias formed in the first sealant layer;

first vertical metal wiring formed in the first vias;

a first horizontal wiring layer formed on the sealant layer interconnecting the first chip layer and the first vertical metal wiring; and a plurality of package layers formed on the first sealant layer, wherein:

each of the plurality of package layers includes a chip layer, a sealant layer covering the chip layer, and vertical metal wiring and a horizontal wiring layer interconnecting adjacent package layers, each sealant layer of the plurality of package layers is formed on a top of a sealant layer of a preceding package layer, and each sealant layer of the plurality of package layers and the sealant layer of the preceding package layer are in contact with each other.

10. The 3D system-level packaging structure according to claim 9, wherein:

a chip layer of a package layer of the plurality package layers is stacked on a sealant layer of a preceding package layer;

a sealant layer of the package layer is formed on the sealant layer of the preceding package layer and covering the chip layer of the package layer while exposing bonding pads of the chip layer;

vias are formed in the sealant layer of the package layer and extending to a horizontal wiring layer of the preceding package layer;

a vertical metal wiring is formed in the vias and connecting with the horizontal wiring layer of the preceding package layer; and a horizontal wiring layer of the package layer is formed on the sealant layer of the package layer and connecting with the vertical metal wiring of the package layer and connecting with the chip layer of the package layer.

11. The 3D system-level packaging structure according to claim 9, further including:

a first protection layer formed on a top-level sealant layer and partially exposing a top-level horizontal wiring layer;

a metal redistribution layer formed on the first protection layer and connecting the top-level horizontal wiring layer;

a second protection layer formed on the first protection layer and partially exposing the metal redistribution layer;

an under-the-ball metal layer formed on the exposed metal redistribution layer; and metal solder balls formed on the under-the-ball metal layer.

12. The 3D system-level packaging structure according to claim 9, further including:

a first protection layer formed on a top-level sealant layer and partially exposing a top-level wiring layer;

an under-the-ball metal layer formed on the exposed top-level wiring layer; and metal solder balls formed on the under-the-ball metal layer.

13. The 3D system-level packaging structure according to claim 12, wherein:

the first protection layer or the second protection layer is made of polyimide.

14. The 3D system-level packaging structure according to claim 9, wherein:

the first chip layer or the chip layer includes at least one of a chip group and a passive device group;

the chip group includes one or more chips; and the passive device group includes any of capacitors, resistors, and inductors.

15. The 3D system-level packaging structure according to claim 9, wherein:
the sealant layer is made of epoxy.

16. The 3D system-level packaging structure according to claim 9, wherein:
the sealant layer is formed by turn injection, compression, or printing.

17. The method for 3D system-level packaging according to claim 1, wherein the first sealant layer covers a top surface of the first chip layer while exposing the bonding pads of the first chip layer.

18. The method for 3D system-level packaging according to claim 17, wherein the first sealant layer has approximately a same thickness as a thickness of the first chip layer.

19. The 3D system-level packaging structure according to claim 9, wherein the first sealant layer covers a top surface of the first chip layer while exposing the bonding pads of the first chip layer.

20. The 3D system-level packaging structure according to claim 19, wherein the first sealant layer has approximately a same thickness as a thickness of the first chip layer.

\* \* \* \* \*